(12) United States Patent
Keith et al.

(10) Patent No.: US 7,511,369 B2
(45) Date of Patent: Mar. 31, 2009

(54) BGA-SCALE STACKS COMPRISED OF LAYERS CONTAINING INTEGRATED CIRCUIT DIE AND A METHOD FOR MAKING THE SAME

(75) Inventors: Gann Keith, Tustin, CA (US); William E. Boyd, San Clemente, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 362 days.

(21) Appl. No.: 11/062,507

(22) Filed: Feb. 22, 2005

(65) Prior Publication Data

US 2007/0158805 A1  Jul. 12, 2007

Related U.S. Application Data

(63) Continuation-in-part of application No. 10/968,572, filed on Oct. 19, 2004, which is a continuation of application No. 10/128,728, filed on Apr. 22, 2002, now Pat. No. 6,806,559.

(60) Provisional application No. 60/546,598, filed on Feb. 20, 2004.

(51) Int. Cl.
*H01L 23/48* (2006.01)

(52) U.S. Cl. ............... 257/690; 257/693; 257/734; 257/773; 257/787; 257/E23.011; 257/E23.036; 257/E23.061

(58) Field of Classification Search .......... 257/723, 257/E25.006, E25.013, E25.018, E25.021, 257/E25.027, E23.085, E21.614, 666–686, 257/690, 773–786; 438/109
See application file for complete search history.

(56) References Cited

U.S. PATENT DOCUMENTS

| 5,424,920 | A | * | 6/1995 | Miyake | 361/735 |
| 5,677,566 | A | * | 10/1997 | King et al. | 257/666 |
| 5,801,448 | A | * | 9/1998 | Ball | 257/778 |
| 5,834,832 | A | * | 11/1998 | Kweon et al. | 257/676 |
| 6,338,973 | B1 | * | 1/2002 | Terrill | 438/15 |
| 6,650,013 | B2 | * | 11/2003 | Yin et al. | 257/736 |
| 2006/0076671 | A1 | * | 4/2006 | Kariya et al. | 257/702 |

* cited by examiner

*Primary Examiner*—Jasmine J Clark
(74) *Attorney, Agent, or Firm*—W. Eric Boyd, Esq.

(57) ABSTRACT

A three dimensional electronic module is disclosed. Conventional TSOP packages are modified to expose internal lead frame interconnects, thinned and stacked on a reroute substrate. The reroute substrate comprises conductive circuitry for the input and output of electrical signals from one or more TSOPs in the stack to a ball grid array pattern. The exposed internal lead frames are interconnected and routed on one or more side buses on the module to the reroute substrate for connection to external electronic circuitry. Alternatively, internal wire bonds or ball bonds may be exposed in the TSOP packages and routed to the side bus for interconnection to create a BGA scale module. One or more neolayers may also be bonded to a reroute substrate to create a BGA scale module.

11 Claims, 5 Drawing Sheets

*(After Dicing)*

*(Before Dicing)*

BGA-SCALE STACKS COMPRISED OF LAYERS CONTAINING INTEGRATED CIRCUIT DIE AND A METHOD FOR MAKING THE SAME

CROSS REFERENCE TO RELATED APPLICATIONS

This patent application claims the benefit of U.S. Provisional Patent Application No. 60/546,598 filed on Feb. 20, 2004, and is a continuation-in-part of U.S. patent application Ser. No. 10/968,572, filed Oct. 19, 2004, which, in turn is a continuation of U.S. patent application Ser. No. 10/128,728, filed Apr. 22, 2002, and issued as U.S. Pat. No. 6,806,559.

STATEMENT REGARDING FEDERALLY SPONSORED RESEARCH AND DEVELOPMENT

N/A

BACKGROUND OF THE INVENTION

1. Field of the Invention

The invention relates generally to a multilayer microelectronic module and a method for making such a module. Specifically, the invention relates to a three-dimensional module comprised of electrically interconnected layers wherein at least one layer of which incorporates a thin small outline package (TSOP) that has been modified to have a surface area of an industry-standard (e.g., JEDEC) BGA package. Each TSOP layer may optionally be thinned so as to minimize the vertical height of the stack.

2. Description of the Prior Art

The demand for computer memory in the form of ball grid array packages (BGA) is increasing due greater memory capacity and speed available in such packages and to the smaller form factor or "foot print" of the BGA format.

BGA packages utilize solder ball interconnects on the underside of the package to interconnect the power and I/O from the semiconductor die within the package to external electronic circuitry. BGA packages therefore do not require the use of external outwardly projecting leads for interconnection as do TSOPs, so applications where small form factor is desirable tend to utilize BGA packages.

Further, computer memory manufactures are increasingly offering newer, more expensive, memory products only in a BGA format. This, in turn, results in end product manufactures, such as DIMM or server manufactures designing printed circuit boards and electronic assemblies such that only BGA memory packages can be used in or on the end product.

The previous generation of memory packaging technologies incorporated memory IC chips into a thin small outline package referred to as a TSOP. Because the TSOP packaging technology and manufacturing processes are mature, the TSOP memory product family tends to be well qualified, low cost and readily available.

To enhance TSOP memory circuit density, industry has taken advantage the ability to vertically stack and interconnect two or more layers containing TSOP or other microelectronic circuitry, to form high density, three-dimensional modules. The stacking of TSOP memory packages is known in the art as is reflected by U.S. patents issued to Irvine Sensors Corporation, assignee herein, such as U.S. Pat. No. 6,026,352 to Eide, U.S. Pat. No. 6,806,559, to Gann, et al., or U.S. Pat. No. 6,706,971 to Albert, et al., each of which is fully incorporated herein by reference.

With respect to stacking BGA packages, the available BGA packages are both expensive and have unique internal and external design characteristics and thermal issues that do not readily lend themselves to thinning, stacking and interconnecting. On the other hand, TSOPs are readily available, easily thinned and are relatively low in cost, but lack the standard BGA form factor desired by industry.

The present invention combines certain of the benefits available in both packages by providing a BGA scale stack comprised of at least one modified, thinned or unthinned TSOP layer.

SUMMARY OF THE INVENTION

A three-dimensional electronic module comprised of one or more layers containing modified TSOP packages is disclosed along with a method for making the device.

In a preferred embodiment, two or more conventional TSOP packages and a base reroute substrate are stacked and bonded together to form an electronic module. The TSOP layers are modified by removing a predetermined portion of the encapsulant packaging, TSOP external leads and internal lead frame, whereby a cross-sectional portion of the existing TSOP internal lead frame is exposed on one or more longitudinal or lateral sides of the module to form one or more sets of lead frame access leads.

The reroute substrate generally comprises a printed circuit board, flex circuit or equivalent structure for the rerouting of electrical signals. The reroute substrate comprises appropriate conductive traces and peripheral reroute substrate access leads and is bonded to the underside of the TSOP stack module. The reroute substrate further comprises a solder ball pattern whereby the module can be electrically connected to an industry standard BGA connection, such as is found on a printed circuit board.

Appropriate access leads from each layer are interconnected using metalized conductive traces forming "T-connects", which are disposed upon one or more of the module perimeter sides. The TSOP access leads are also in electrical connection with appropriate access leads on the reroute substrate, which, in turn, routes the power, ground and I/O signals to and from the layers to the appropriate location on the reroute substrate solder ball pattern located on the underside of the module. Neolayers containing encapsulated integrated circuit chips or surface-ablated TSOP packages may also be used in the layers.

The bonded and interconnected layers form a three-dimensional electronic module with high circuit density that is low in cost, easy to produce and is readily connected to an industry standard BGA conductor pattern.

One aspect of the invention takes advantage of the unique topography of existing TSOP lead frame structure, allowing access leads to be formed and interconnected on four perimeter sides of the module while concurrently creating a module that precisely fits the geometry and profile of standardized BGA packages.

A further aspect of the invention include layers comprised of TSOP layers which are thinned to expose ball bond pads or wire bonds on the die, which are electrically rerouted to an edge and interconnected along one or more sides of the module.

Yet a further aspect of the invention comprises layers containing one or more integrated circuit die that have been encapsulated and had their respective active surfaces covered in a dielectric. Integrated circuit bond pads are exposed through the dielectric and are electrically routed to an edge using metalized traces, which traces are used to route signals in and out of the reroute substrate.

While the apparatus and method has or will be described for the sake of grammatical fluidity with functional explanations, it is to be expressly understood that the claims, of the non-provisional patent application, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

The invention and its various embodiments can be better understood by turning to the following detailed description of the preferred embodiments which are presented as illustrated examples of the invention that will be defined in the claims. It is expressly understood that the invention as will be defined by the claims may be broader than the illustrated embodiments described below.

DESCRIPTION OF THE PREFERRED EMBODIMENTS

Figure 1A:
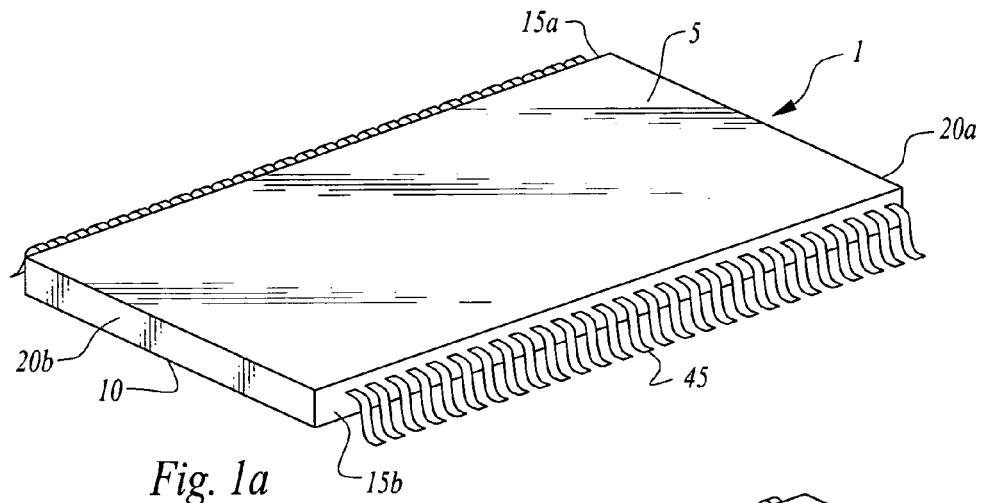
FIGS. 1a and 1b show a perspective view of the external and internal configuration, respectively, of a conventional thin small outline package or TSOP.
Figure 1B:
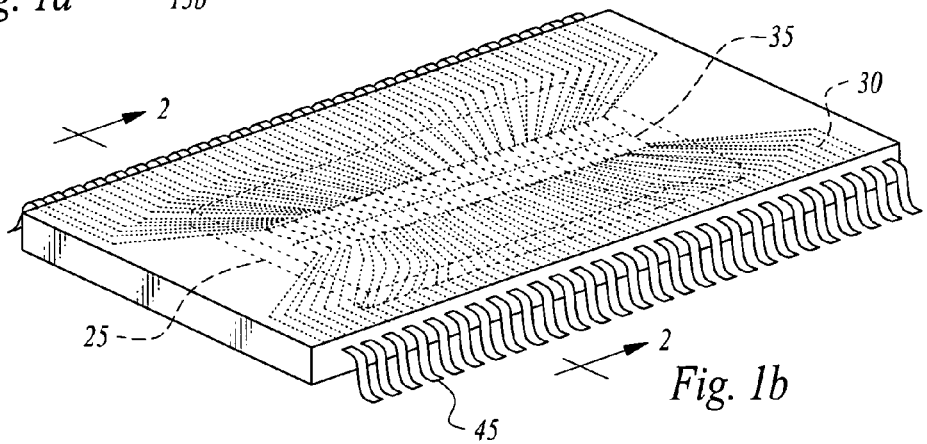

Turning now to the figures wherein like numerals designate like elements among the several views, FIGS. 1a and 1b illustrate a conventional, commercially available TSOP package 1, comprised typically of an integrated circuit chip molded within an encapsulating material with a plurality of electrical leads outwardly depending from the encapsulant. As will be discussed, FIG. 1b shows the internal layout of a TSOP comprising an integrated circuitry chip.

Package 1 is generally rectangular in top plan view and comprises an upper surface 5, a lower surface 10, a first pair of sides 15a, 15b along a longitudinal dimension and a second pair of opposing sides 20a, 20b along a lateral dimension.

Figure 2:
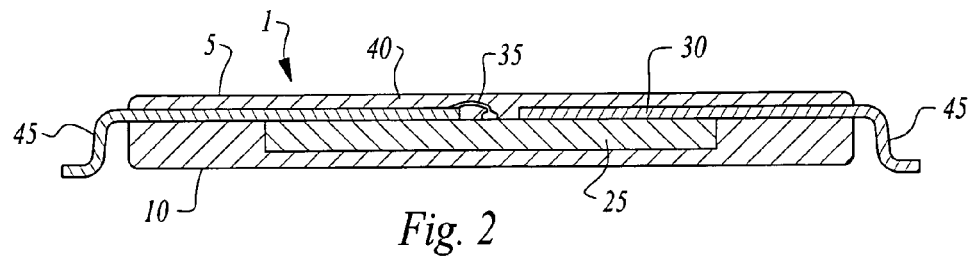
FIG. 2 is a sectional view of the TSOP of FIGS. 1a and 1b of the present invention.

FIG. 2 shows a cross-section of the TSOP of FIGS. 1a and 1b, illustrating the internal integrated circuit die 25, such as a memory chip, in electrical connection with an internal lead frame 30 via wire bond connection 35. Lead frame 30 is made from a conductive metal such as copper and is utilized so as to electrically connect integrated circuit die 25, wire bond 35 and lead frame 30, all of which are encapsulated with encapsulant 40. Outwardly projecting TSOP leads 45 comprise the externally projecting portion of lead frame 30 and extend from encapsulant 40 for electrical connection to and from integrated circuit die 25 and TSOP leads 45 to permit connection to external circuitry.

Figure 3:
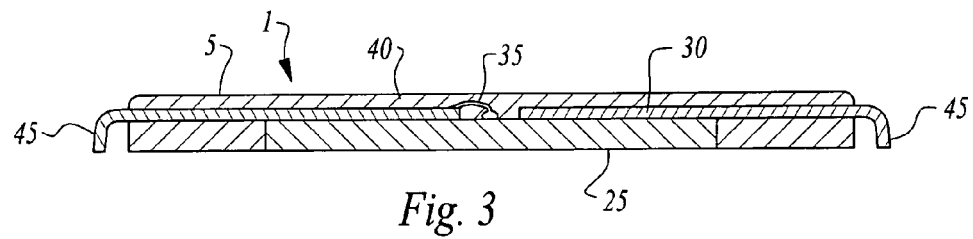
FIG. 3 is a sectional view of the thinned TSOP of the present invention, with a portion of its lower surface and inactive surface of the internal integrated circuit die removed.

With respect to FIG. 3, in a preferred embodiment of the invention, package 1 may be thinned by removing a predetermined portion of encapsulant 40 from upper surface 5, lower surface 10, or both surfaces, such as by lapping or grinding. As is known in the art, it is possible to remove a predetermined portion of lower surface 10 to include removing a portion of the inactive undersurface of integrated circuit die 25 to minimize the thickness of the TSOP package.

As will be discussed more fully below, FIGS. 4a and 4b disclose reroute substrate 50 comprising a set of electrically conductive traces 55, solder ball connection pads 60 and through-hole via interconnects 65. A predefined set of conductive traces 55 terminate at or near the longitudinal and lateral periphery of reroute substrate 50 and will subsequently be modified to define reroute substrate access leads for interconnection to side bus metalization to create T-connects.

Figure 4A:
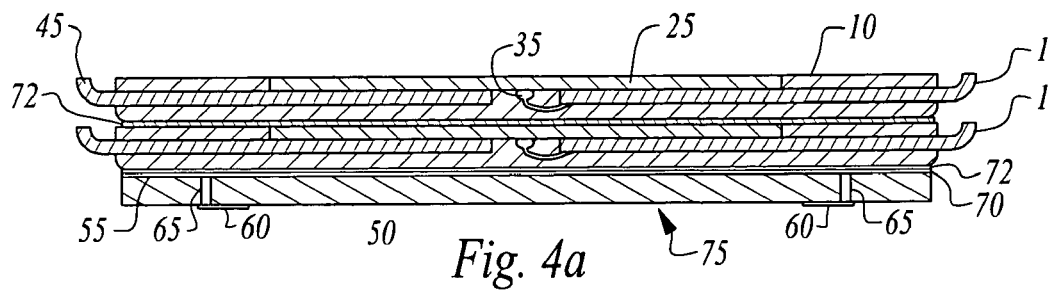
FIG. 4 is a module of the present invention with two thinned TSOPs stacked and bonded to a reroute substrate prior to having the external TSOP leads removed.
Figure 4B:
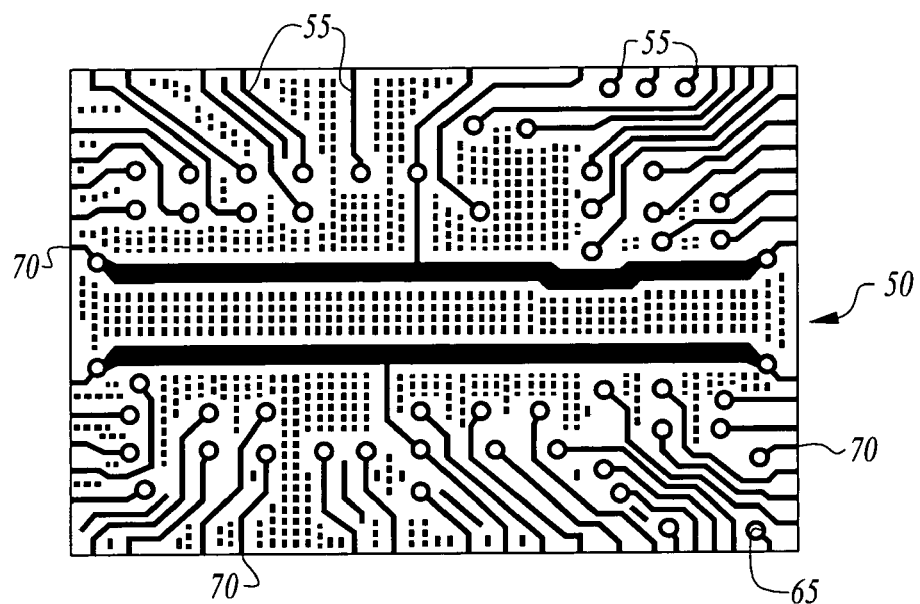

FIG. 4a further illustrates a plurality of packages 1 and reroute substrate 50 which are stacked with TSOP leads 45 in substantial vertical registration with their respective ones and reroute substrate access leads 70 in substantial vertical registration with TSOP leads 45. The plurality of packages 1 and reroute substrate 50 are bonded together with a suitable adhesive 72, such as an epoxy, to form a stack of TSOP layers with a reroute substrate on the lower surface thereof, creating an integrated, three-dimensional module 75.

Figure 5:
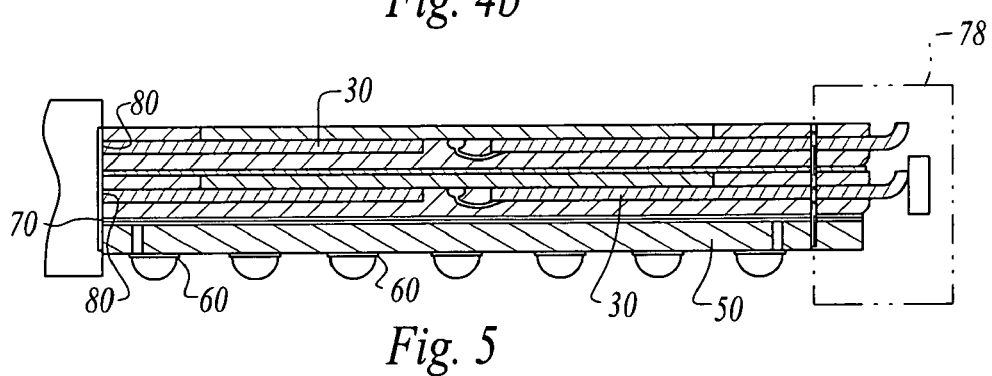
FIG. 5 is a module of the present invention showing the left side of the module having the external TSOP leads removed and side bus metalization connecting internal TSOP lead frame access leads to reroute substrate access leads.

Turning now to FIG. 5, after the module is assembled and bonded, a predetermined portion 78 of one or more of longitudinal sides 15a or 15b, or lateral sides 20a or 20b, is removed, such as by saw-cutting, grinding, lapping or the like, to expose a cross-sectional area of internal lead frame 30 to define one or more lead frame access leads 80 and to expose a cross-sectional area of the electrically conductive traces of reroute substrate 50 to define one or more reroute substrate access leads 70.

The forming of lead frame access leads 80 and reroute substrate access leads 70 creates a set of electrically conductive interconnect points about the longitudinal and/or lateral sides of the module which allows circuitry in each of the package-containing layers to be routed to solder ball connection pads 60 on the underside of reroute substrate 50.

Upon exposure of the sets of access leads on the selected lateral and longitudinal sides, an electrically conductive metalization, such as by plating, is applied on the entire side, effectively shorting each exposed access lead contained thereon and forming a metalized T-connect of perpendicularly disposed conductors where the metalization and access leads interconnect.

Selected metalized conductive traces are then formed at predetermined locations on the longitudinal or lateral sides by removing selected portions of the metalization, such as by saw-cutting or laser ablation. This creates electrically conductive traces between user-selected access leads on the various layers, which leads are, in turn, routed to the reroute substrate solder ball pattern.

An alternative embodiment of the invention comprises the removal of a predetermined portion of each of the longitudinal and lateral sides of plurality of packages 1, such that lead frame access leads are exposed on each of the four sides of the plurality of packages 1. A complementary reroute substrate is provided such that access leads are available at desired locations about the entire periphery of the module.

Figure 6:
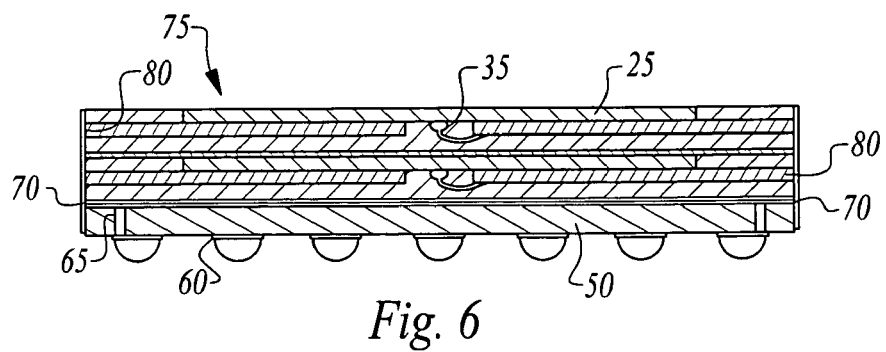
FIG. 6 is an exemplar module of the present invention showing opposing sides of the module having the external TSOP leads removed and side bus metalization connecting internal TSOP lead frame access leads to reroute substrate access leads.

As is illustrated in FIG. 6, when package 1 is modified in this manner, advantage may be taken of the unique topography of internal lead frame 30 whereby the footprint of the module itself is minimized while available interconnections to access leads is maximized. It has been determined by Irvine Sensors Corp., assignee herein, that when packages 1 are modified in this manner, a high density module formed from inexpensive, readily available TSOP packages can be adapted for use in BGA applications.

Upon assembly of any of the preferred embodiments, solder balls are applied to solder ball connection pads 60 for electrical interconnection to an external electronic circuit.

Figure 7:
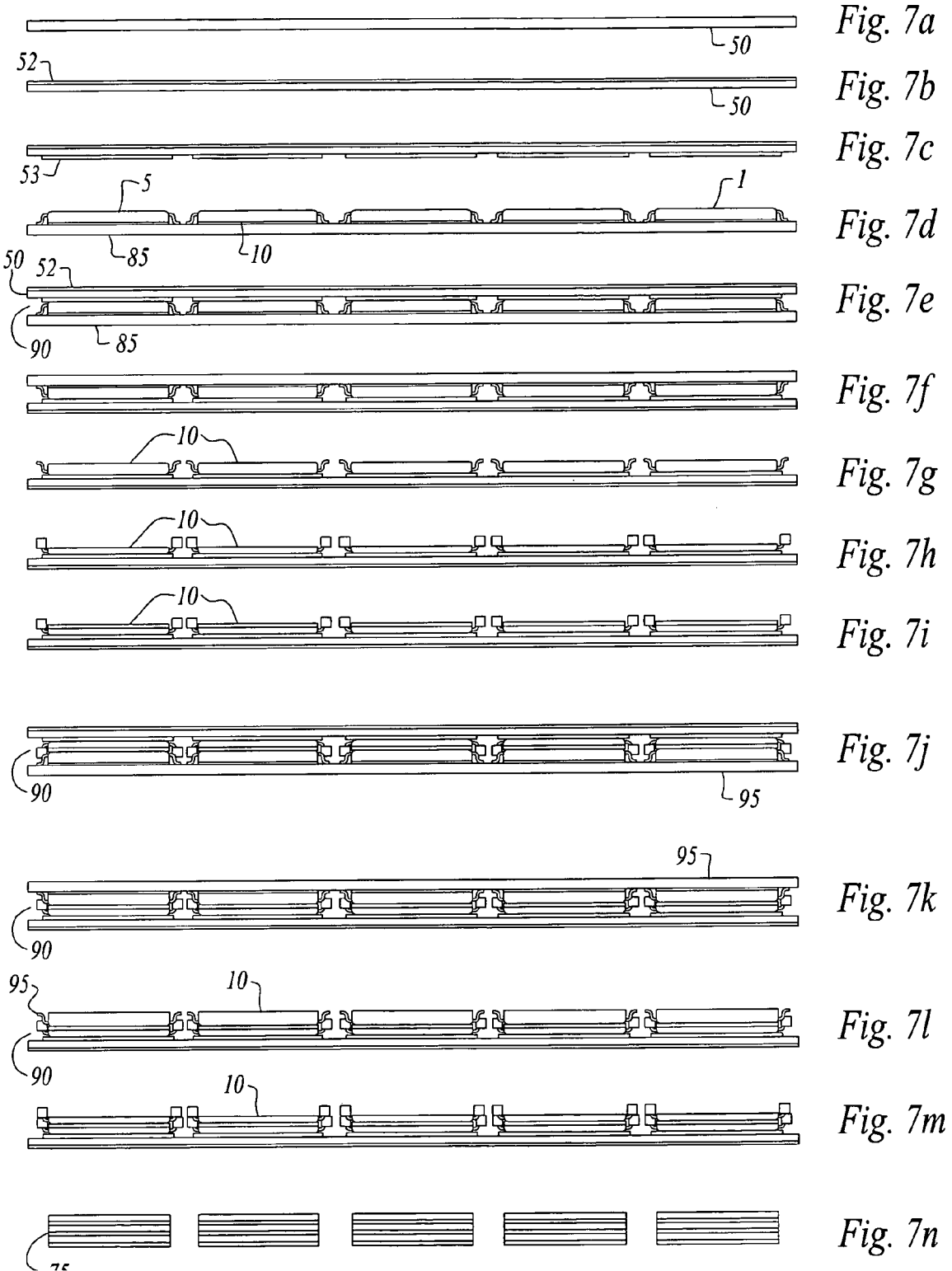
FIGS. 7a-7n illustrate process steps of a preferred method for making the invention.

Referring to FIGS. 7a through 7n, a preferred method for making the device is shown. As illustrated in FIG. 7a, reroute substrate 50, such as a printed circuit board or flex circuit, is provided which includes one or more sets of appropriate conductive traces (not shown) for subsequent electrical interconnection and for the receiving of one or more sets of solder balls for later ball grid array interconnection. Reroute substrate 50 is preferably a multilayer printed circuit board or flex circuit and is configured so that the conductive traces will allow side-busing of a module using access leads as discussed.

FIG. 7b illustrates a temporary adhesive 52 such as a thermoplastic, after it has been applied.

FIG. 7c shows reroute substrate 50 with a printed epoxy 53 applied, the printed epoxy pattern being defined for the receiving of one or more TSOP packages 1.

Turning to FIG. 7d, a first sacrificial substrate or removable positioning fixture 85 is provided. The first positioning fixture is provided with one or more packages 1 thereon, each package 1 having an upper surface 5 and a lower surface 10. Packages 1 are preferably fixedly disposed on the first positioning surface by means such as soldering the TSOP leads or by an adhesive, lower surface 10 being oriented toward the first positioning surface.

FIG. 7e illustrates the step of the bonding of the upper surface 5 of the packages 1 to the printed epoxy areas on reroute substrate 50 to form a manufacturing assembly 90.

FIG. 7f shows the manufacturing assembly 90 during curing.

FIG. 7g reflects manufacturing assembly 90 after removal of the first positioning fixture for further processing.

As seen in FIG. 7h, a predetermined portion of the lower surface 10 of package 1 is removed, such as by grinding, and a layer of epoxy is disposed thereon.

Turning to FIGS. 7i-7m, a second positioning fixture 95 with a second set of packages 1 is bonded to manufacturing assembly 90 whereby upper surface 5 of packages 1 of the second positioning fixture are bonded to lower surface 10 of the first set of packages 1. The second positioning fixture 95 is removed and a predetermined portion of lower surface 10 of second set of packages 1 is removed. Note that these steps can be repeated as defined by the user to create TSOP stacks comprised of more than two TSOP layers or that a single TSOP package can be modified so as to fit into a BGA format.

When the desired number of layers have been stacked and bonded, the multilayered subassembly is singulated, typically by dicing or sawing, into individual stacks of thinned TSOP layers such as shown in FIG. 7m, so that the internal lead frame cross-sections are exposed on one or more sides of module 75.

As discussed further, this singulation step may beneficially take advantage of the unique internal structure of a TSOP, i.e. the die layout and lead frame geometries. By dicing the TSOP so that its surface area is that of an industry standard BGA form factor, the external TSOP leads 45 are removed and internal lead frame 30 is partially removed, exposing the lead frame cross-section about the periphery of the modified packages 1. These exposed lead frame portions are conveniently used as interconnect points to allow the vertical interconnection of one or more modified TSOP layers on each pair of the lateral sides and longitudinal sides of the module.

Figure 8:
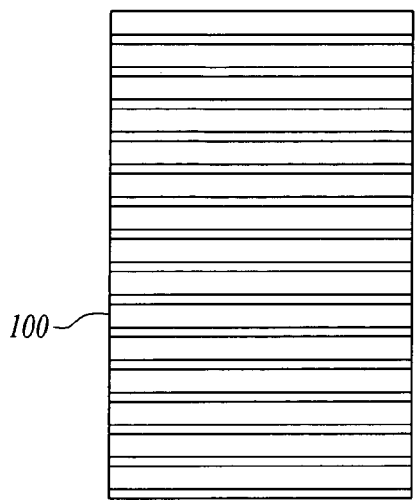
FIG. 8 shows a "stack of stacks" of FIGS. 7a-7n, temporarily bonded to facilitate processing.

The stacks are laminated as "stacks of stacks" 100 as shown in FIG. 8 to simplify subsequent process steps such as module side-bus metalization.

Figure 9:
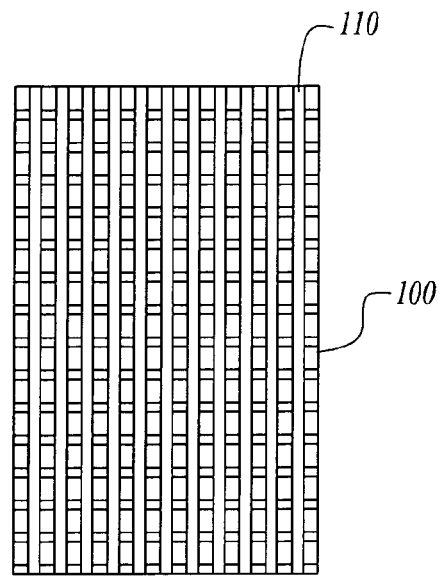
FIG. 9 illustrates the definition of copper traces on a side of the "stack of stacks" of FIG. 8.

Suitable conductive traces 110 are defined on the sides of the laminated stack to allow the interconnection of the exposed lead frame portions, as illustrated in FIG. 9.

Note the potential use of lead frame "no connect" lead cross-sections, that is, unconnected lead frame portions, within the TSOP structure, which may desirably be used as locations for defining conductive traces on the longitudinal and lateral sides of packages 1 to allow more complex side-busing schemes.

Figure 10:
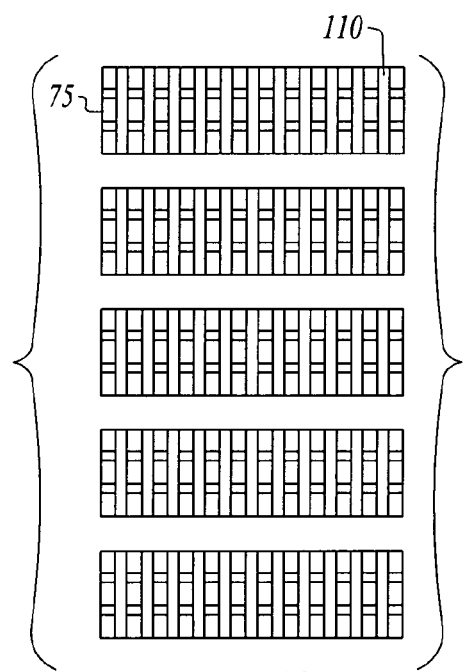
FIG. 10 shows the singulation of the "stack of stacks" into individual modules, FIG. 11 discloses the BGA solder ball attachment to the reroute substrate.
Figure 11:
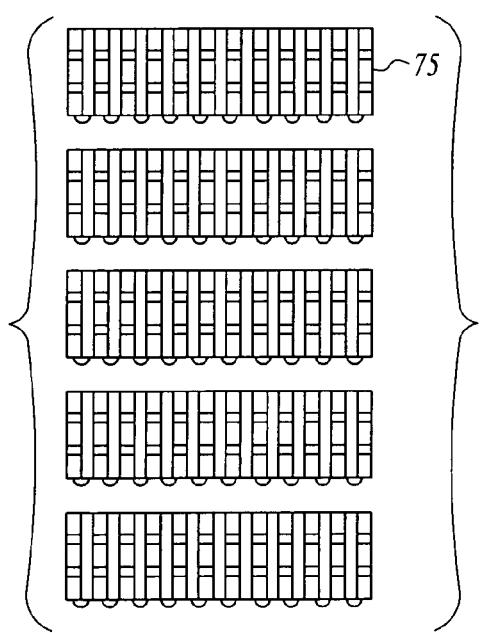

FIGS. 10 and 11 illustrate the steps of stack singulation and solder ball attachment, resulting in the creation of a stack of thinned TSOP layers with a form factor and electrical interconnection layout of an industry standard BGA package.

Alternatively, readily available semiconductor wafers with integrated circuit die formed thereon may be inexpensively purchased, diced and packaged in TSOP format to facilitate the use of the aforementioned process. Repackaging of integrated circuit die in BGA packages is presently prohibitively expensive.

Figure 12A:
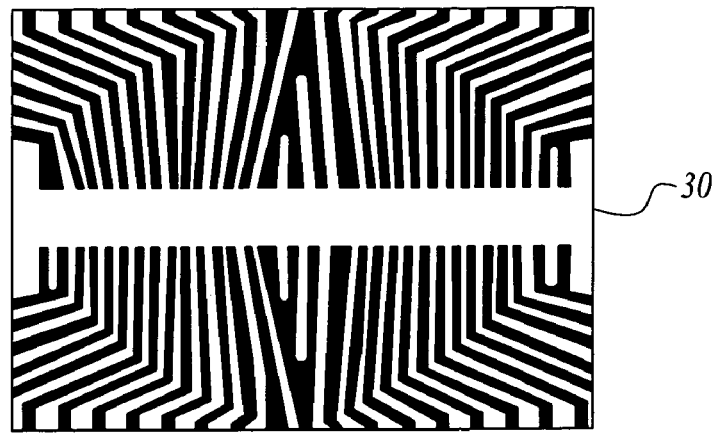
FIGS. 12a and 12b show the internal construction and layout of a conventional TSOP lead frame before and after a predetermined amount of each side of the TSOP have been removed and illustrating the lead frame access leads terminating at each of the sides for creating a BGA scale package.
Figure 12B:
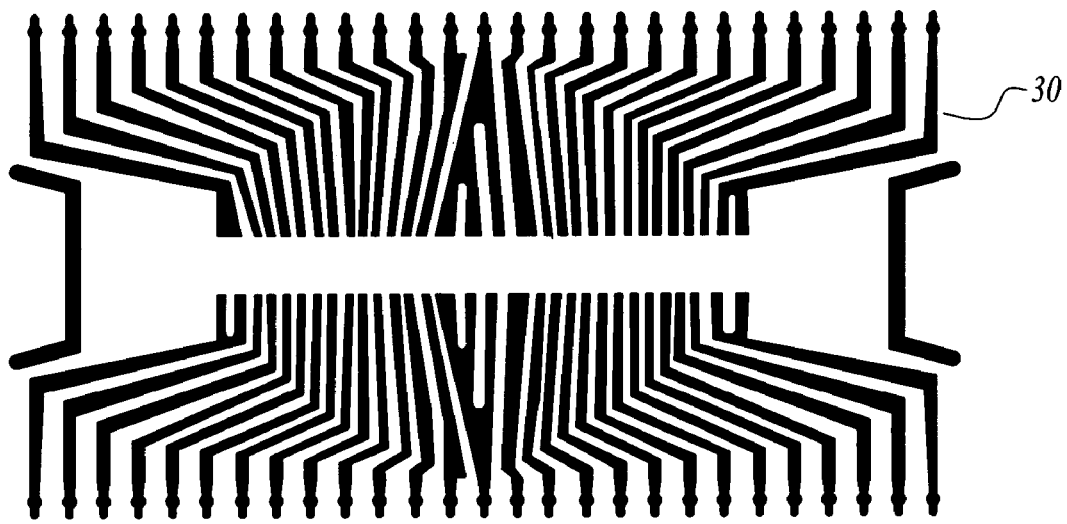

FIGS. 12a and 12b illustrate a TSOP lead frame configuration prior to the removal of longitudinal sides 15a and 15b and lateral sides 20a and 20b as well as the resulting configuration after removal, and the definition of lead frame access leads on all forum perimeter surfaces. As seen in FIG. 12a, the resultant electronic module is in a BGA form factor for use in BGA applications with a very low (i.e. 1.5 mm) vertical profile. The resultant module takes advantage of proven, industry standard TSOP manufacturing techniques and a production process that is inexpensive due to its ability to allow process steps on multiple in-process modules.

It is to be specifically noted that it is not necessary to thin the TSOP layers if vertical height is not an important factor in the resultant module.

An alternative embodiment for providing a stackable microcircuit layer which may be stacked according to the present invention makes use of the internal wire bond or ball pad interconnect to the integrated circuit die 25 of a TSOP package. A method for creating such a layer is disclosed in U.S. Pat. No. 6,706,971, as noted above.

Figure 13:
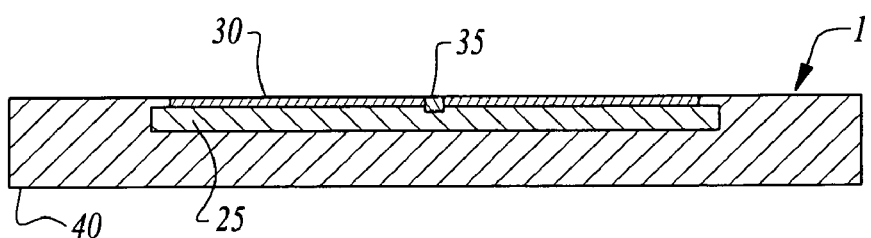
FIG. 13 illustrates a plastic encapsulated microcircuit that has been modified to expose a ball bond for subsequent reroute to an edge for use in a layer.

As can be readily seen in FIG. 13, in this embodiment, a predetermined portion of encapsulant 40 is removed or ablated, as by lapping, grinding, etching or equivalent method, from upper surface 5 whereby wire bond 35 is exposed at approximately the depth of the ball bond where wire bond 35 connects to integrated circuit die 25. The exposed ball bond is electrically routed to one or more sides of the modified TSOP by using interconnecting metalized conductive traces on the upper surface of the modified package, which acts as a dielectric surface. Access leads can then be formed at the terminations of the conductive traces on the surface of the modified TSOP.

A further preferred embodiment of the above invention comprises a module 75 comprised of at least one plastic encapsulated microcircuit (PEM), such as a TSOP, that includes (a) a microcircuit having an active surface containing integrated circuitry and a wire bond pad, and (b) an encapsulant in contact with the microcircuit; and modifying the PEM to produce a modified PEM having a modified surface on which modified surface is exposed a wire bond cross-section, also referred to herein as a conductive member, which may include the ball bond portion of the wire bond or the wire bond cross-section itself, that is electrically connected to the bond pad.

In a second aspect of the above embodiment, the invention may be regarded as a module comprising at least one PEM that includes: (a) a microcircuit having a bond pad, (b) a lead frame, connected to the bond pad, and (c) a plastic body encapsulating the microcircuit, the bond pad, and at least part of the lead frame; and (d) grinding a top surface of the PEM to remove a top portion of the plastic body along with at least part of the lead frame to leave a planar section that contains the microcircuit and the bond pad.

In a third aspect of the above embodiment, the invention may be regarded as a module comprising at least one plastic encapsulated microcircuit (PEM) that includes (a) a microcircuit having an active surface containing integrated circuitry and a bond pad, (b) a wire bond connected to the bond pad, a lead frame, and a wire that connects the wire bond to the lead frame, and (d) a plastic body that encapsulates the known-good microcircuit, the wire bond, the wire, and at least a portion of the lead frame; grinding a surface of the PEM to remove the lead frame and the wire and form a modified PEM that contains the microcircuit, the bond pad, and the wire bond, the modified PEM having a modified surface on which modified surface is exposed the wire bond that is connected to the bond pad; and forming an electrical lead on the modified surface that leads from the wire bond to an edge of the modified PEM.

In a fourth aspect of the above embodiment, the invention may be regarded as a module comprising: (1) a modified section of a plastic encapsulated microcircuit (PEM) that originally contained (a) a known-good microcircuit having a bond pad, (b) a conductive lead assembly connected to the bond pad, and (c) a plastic body encapsulating the known-good microcircuit, the bond pad, and the conductive lead assembly, the modified section formed by removing a portion of the conductive lead assembly from the PEM; the modified section having a modified surface, the modified section containing the known-good microcircuit, the bond pad, and a remaining portion of the conductive lead assembly with an end thereof exposed on the modified surface; and (2) a reroute lead on the modified surface of the modified section to connect the exposed portion of the remaining portion of conductive lead assembly with an edge of the modified section.

In yet a further alternative embodiment, a BGA scale module comprised of neolayers, such as is disclosed in U.S. Pat. No. 6,797,537, to Pepe, et al., or U.S. Pat. No. 6,784,547 to Pepe, et al., each of which is fully incorporated herein by reference.

A neolayer generally comprises a layer containing one or more integrated circuit die encapsulated into a plastic material with a dielectric disposed over the active surface of the die. The bond pads of the die are exposed through the dielectric and reroute metalization from the bond pads to the periphery of the neolayer is formed to define at least one neolayer access lead on the edge of the layer. The use of neolayers in the disclosed invention allows a plurality of die to exist in one layer, which layer or layers may be bonded to a reroute substrate to form a BGA scale module. The die may be heterogeneous or homogeneous within the layer or within the stack. The use of neolayers allows support circuitry, FPGA die or other ICs to existing in a BGA scale stack comprised of modified TSOPs or entirely of one form of layer.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. An electronic module comprised of:
   at least one TSOP package having an upper surface and a lower surface and having a pair of longitudinal sides and a pair of lateral sides, said TSOP package comprising an encapsulant, an integrated circuit die and an internal lead frame,
   at least one of said longitudinal or lateral sides having a predetermined portion of said encapsulant removed to define at least one lead frame access lead that is exposed on and coplanar with the surface of its respective longitudinal or lateral side,
   a reroute substrate bonded to said lower surface and comprising at least one electrically conductive trace and at least one reroute substrate access lead,
   said at least one reroute substrate access lead in electrical connection with said at least one electrically conductive trace, said lead frame access lead in electrical connection with said reroute substrate access lead by means of a metalized trace defined upon and coplanar with said longitudinal or lateral side,
   means for electrically connecting said at least one conductive metal trace to an external electronic circuit.

2. The electronic module of claim 1 comprising at least one metalized T-connect.

3. The electronic module of claim 1 comprising a T-connect on at least one of said longitudinal sides.

4. The electronic module of claim 1 comprising a T-connect on at least one of said lateral sides.

5. The electronic module of claim 1 comprising a T-connect on at least one of said longitudinal sides and at least one of said lateral sides.

6. The electronic module of claim 1 comprising a T-connect on two of said longitudinal sides and at least one of said lateral sides.

7. The electronic module of claim 1 comprising a T-connect on at least one of said longitudinal sides and two of said lateral sides.

8. The electronic module of claim 1 comprising a T-connect disposed upon two of said longitudinal sides and two of said lateral sides.

9. The electronic module of claim 1 wherein said at least one TSOP package is thinned, said electronic module further comprising at least one neolayer or modified PEM that is bonded to and in electrical connection with said TSOP package to define a three-dimensional electronic module.

10. The electronic module of claim 1 wherein said electrical connection between said at least one conductive metal trace and said external electronic circuit is a solder ball.

11. The electronic module of claim 1 wherein the upper surface of said at least one TSOP package has been modified to be substantially equal to that of a BGA package.

* * * * *

UNITED STATES PATENT AND TRADEMARK OFFICE
CERTIFICATE OF CORRECTION

PATENT NO. : 7,511,369 B2  Page 1 of 1
APPLICATION NO. : 11/062507
DATED : March 31, 2009
INVENTOR(S) : Gann Keith It is certified that error appears in the above-identified patent and that said Letters Patent is hereby corrected as shown below:

On the title page,

[*] Notice:   Subject to any disclaimer, the term of this patent is extended or adjusted under 35 USC 154(b) by (362) days Delete the phrase "by 362 days" and insert -- by 765 days --

Signed and Sealed this

Twentieth Day of April, 2010

David J. Kappos
*Director of the United States Patent and Trademark Office*